United States Patent
Iida et al.

(10) Patent No.: US 7,226,506 B2
(45) Date of Patent: Jun. 5, 2007

(54) SINGLE CRYSTAL SILICON PRODUCING METHOD, SINGLE CRYSTAL SILICON WAFER PRODUCING METHOD, SEED CRYSTAL FOR PRODUCING SINGLE CRYSTAL SILICON, SINGLE CRYSTAL SILICON INGOT, AND SINGLE CRYSTAL SILICON WAFER

(75) Inventors: Tetsuhiro Iida, Nagasaki (JP); Yutaka Shiraishi, Nagasaki (JP); Ryota Suewaka, Nagasaki (JP); Junsuke Tomioka, Nagasaki (JP)

(73) Assignee: Sumco Techxiv Corporation, Hiratsuka-Shi, Kanagawa (JP)

( * ) Notice: Subject to any disclaimer, the term of this patent is extended or adjusted under 35 U.S.C. 154(b) by 224 days.

(21) Appl. No.: 10/512,022

(22) PCT Filed: Apr. 17, 2003

(86) PCT No.: PCT/JP03/04868

§ 371 (c)(1),
(2), (4) Date: Oct. 19, 2004

(87) PCT Pub. No.: WO03/089697

PCT Pub. Date: Oct. 30, 2003

(65) Prior Publication Data

US 2005/0229840 A1  Oct. 20, 2005

(30) Foreign Application Priority Data

Apr. 19, 2002  (JP) ............................. 2002-118281

(51) Int. Cl.
C30B 15/20  (2006.01)

(52) U.S. Cl. ............................ 117/13; 117/14; 117/902

(58) Field of Classification Search ................... 117/13, 117/14, 902
See application file for complete search history.

(56) References Cited

U.S. PATENT DOCUMENTS 4,002,523 A  1/1977  Dyer (Continued)

FOREIGN PATENT DOCUMENTS

JP  57-017494  1/1982

(Continued)

OTHER PUBLICATIONS

Murthy et al.; "Growth of Dislocation-Free Silicon Crystals in the (110) Direction for Use as Neutron Monochromators," *Journal of Crystal Growth*, vol. 52, (1981), pp. 391-395.

(Continued)

Primary Examiner—Felisa Hiteshew
(74) Attorney, Agent, or Firm—Welsh & Katz, Ltd.

(57) ABSTRACT

A method for eliminating slip dislocations in producing single crystal silicon, a seed crystal capable of eliminating the slip dislocations, a single crystal silicon ingot from which the slip dislocations have been eliminated and a single crystal silicon wafer, are disclosed. Single crystal silicon is produced by dipping a seed crystal in a melt and pulling the seed crystal up along the axis of the seed crystal, using a single crystal (1) in which the <110> crystal orientation (10) is inclined at a predetermined angle θ with respect to the axial direction (9) so that the edge direction (8) of the {111} crystal plane is inclined with respect to the axial direction (9). When single crystal silicon is grown while pulling up a seed crystal by the CZ method, a single crystal silicon ingot of a large diameter and a heavy weight can be pulled up by eliminating slip dislocations from the thick crystal.

13 Claims, 8 Drawing Sheets

U.S. PATENT DOCUMENTS 5,911,823 A    6/1999  Sonoda et al.

FOREIGN PATENT DOCUMENTS

| JP | 63123893 | 5/1988 |
| JP | 03080184 | 4/1991 |
| JP | 09-165298 | 6/1997 |

OTHER PUBLICATIONS

Hoshikawa et al.; "Dislocation-Free Czochralski Silicon Crystal Growth without the Dislocation-Elimination-Necking Process," *Japan Journal of Applied Phys.*, vol. 38 (1999) pp. L1369-L1371.

SINGLE CRYSTAL SILICON PRODUCING METHOD, SINGLE CRYSTAL SILICON WAFER PRODUCING METHOD, SEED CRYSTAL FOR PRODUCING SINGLE CRYSTAL SILICON, SINGLE CRYSTAL SILICON INGOT, AND SINGLE CRYSTAL SILICON WAFER

TECHNICAL FIELD

The present invention relates to a method for eliminating slip dislocations in producing single crystal silicon, a seed crystal capable of eliminating the slip dislocations, a single crystal silicon ingot from which the slip dislocations have been eliminated, and a single crystal silicon wafer.

BACKGROUND ART

A CZ method is one of the methods for producing single crystal silicon.

With this method a single crystal silicon ingot is produced by providing quartz crucible in a container for pulling single crystals, that is, a CZ furnace, heating and melting poly-crystalline silicon inside the quartz crucible, dipping a seed crystal mounted on a seed chuck into the melt once the melt has stabilized and growing single crystal silicon by pulling up the seed chuck, while rotating the seed chuck and the crucible in the same direction or opposite directions.

"Slip dislocations" is one of the unavoidable problems encountered when single crystal silicon is grown by the CZ method. Slip dislocations are one-dimensional crystal defects that appear due to thermal stresses occurring when the seed crystal is brought into contact with the melt and they propagate in a fixed direction.

If slip dislocations are included in grown single crystal silicon, quality of the semiconductor device fabricated based on the single crystal silicon is degraded. Therefore, such slip dislocations have to be eliminated.

A technology for eliminating slip dislocations has been established with respect to the production of silicon wafers (<100> axis crystal) with the {100} crystal plane as the surface. Thus, when the seed crystal is pulled up so that the <100> crystal orientation matches the axial direction of the seed crystal, slip dislocations can be easily eliminated from the single crystal silicon by applying necking process which gradually reduces the diameter of the single crystal silicon after the seed crystal has been brought into contact with the melt.

However, it was found that slip dislocations are difficult to eliminate in the production of silicon wafers (<110> axis crystal) with the {110} crystal plane as the surface, that is, when the seed crystal is pulled up so that the <110> crystal orientation matches the axial direction of the seed crystal, and the technology for eliminating slip dislocations in such a process has not yet been established.

When pulling is so conducted that the <110> crystal orientation matches the axial direction of the seed crystal, even if the diameter of the single crystal silicon is appropriately reduced by the necking process, dislocations easily remain in the central portion of the crystal, causing defects in semiconductor devices. Slip dislocations cannot be eliminated unless the diameter of the single crystal silicon is appropriately reduced to a level surpassing that attained when the <100> axis crystal is pulled up.

However, a demand for producing large-diameter silicon wafers has been created in recent years. Accordingly, single crystal silicon ingots with a large diameter and heavy weight have to be pulled up without problems, and if the diameter of the single crystal silicon is reduced, even though slip dislocations can be eliminated to a certain degree, there is a risk of the diameter being too small and making it impossible to pull large-diameter heavy single crystal silicon ingots.

There is a technology called a magnetic field applied Czochralski method (MCZ method). With this method, stable crystal growth is conducted by applying a magnetic field to a melt in order to increase melt viscosity and suppress convection in the melt.

When a magnetic field applied Czochralski method is employed and single crystal silicon is pulled, while a magnetic field is applied to the melt, slip dislocations cannot be eliminated unless the diameter of the single crystal silicon is further reduced by comparison with the process without magnetic field application. Thus, it was experimentally established that slip dislocations cannot be eliminated if the diameter of the single crystal silicon is not reduced to about 2.5 mm.

Japanese Patent Application Laid-open No. 9-165298 describes an invention according to which when pulling is so conducted that the <110> crystal orientation matches the axial direction of seed crystal, slip dislocations are eliminated by reducing the diameter to less than 2.0 mm with a necking process, while single crystal silicon is pulled with a magnetic field being applied by a magnetic field applied Czochralski method.

However, if the invention described in this publication is applied to pulling single crystal silicon ingots of a large diameter and a heavy weight, there is a risk of the necking portion breaking and the crystal falling down, which makes it impossible to use this process.

Further, U.S. Pat. No. 4,002,523 describes a technology for eliminating slip dislocations by obtaining a special shape of single crystal silicon rather than by simply reducing the diameter thereof. This patent discloses a technology for eliminating slip dislocations by conducting multistage cross-section area reduction in a necking process and obtaining a "bulge shape".

However, though obtaining the bulge shape is technologically possible, this is actually difficult to do in an automated process.

With the foregoing in view, a technology is required which is suitable for eliminating slip dislocations by a method other than the necking process (cross-section area reduction) and for trouble-free pulling single crystal silicon ingots which have large diameter and heavy weight.

Further, technologies designed to eliminate defects including dislocations by methods other than the necking process (cross-section area reduction) have been disclosed in a variety of open publications.

Japanese Patent Application Laid-open No. 57-17494 describes an invention according to which when single crystals of compound semiconductors such as InSb are grown, etch pits are eliminated and uniformity of impurity concentration is improved by tilting the pull direction of the seed crystal at an angle of 5–10 degrees with respect to the <110> crystal orientation and pulling the single crystal of the same compound semiconductor.

However, though this publication describes the elimination of etch pits, it does not describe the elimination of slip dislocations. Further, the invention described in this open publication is developed to pull the single crystals of compound semiconductors such as InSb, and is not aimed at preparation of silicon single crystals.

Further, Japanese Patent Application Laid-open No. 3-80184 describes an invention according to which when a single crystal of a compound semiconductor such as GaAs is similarly grown, the single crystal of this compound semiconductor is pulled by setting the pull direction of the seed crystal to any direction between the <001> crystal orientation and <101> crystal orientation and axial dislocations propagating strictly in the growth direction are eliminated. Further, with respect to slip dislocations occurring in the compound semiconductors, this publication describes that "the generation of slip dislocation can be reduced by adding an impurity".

Thus, though this publication describes the elimination of slip dislocations generated in a compound semiconductor such as GaAs by the addition of an impurity, it does not describe a technology for eliminating slip dislocations appearing in single crystal silicon.

DISCLOSURE OF THE INVENTION

With the foregoing in view, it is an object of the present invention to enable the pulling of single crystal silicon with a large diameter and heavy weight by eliminating slip dislocations at a diameter as large as that in case of a <100> axis crystal when the single crystal silicon is grown by pulling a seed crystal by the CZ method.

The first invention provides a method for producing single crystal silicon by which the single crystal silicon is produced by dipping a seed crystal in a melt and pulling the seed crystal up along an axial direction thereof, wherein the seed crystal is pulled up in a state in which a <110> crystal orientation is inclined with respect to the axial direction of the seed crystal.

The second invention provides a method for producing single crystal silicon by which the single crystal silicon is produced by dipping a seed crystal in a melt and pulling the seed crystal up along an axial direction thereof, comprising: a step of preparing the seed crystal in which a <110> crystal orientation is inclined at a predetermined angle $\theta$ with respect to the axial direction; a dislocation network elimination step of gradually reducing a diameter of the single crystal silicon to d1 after the seed crystal has been brought into contact with the melt; and a slip dislocation elimination step of further growing the single crystal silicon by a length of at least d1/tan $\theta$, while maintaining the diameter thereof at almost d1.

The third invention provides the method of the first invention, and the fourth invention provides the method of the second invention, wherein the direction of inclining the <110> crystal orientation with respect to the axial direction of the seed crystal is a direction of rotation about another <110> crystal orientation, which is in a perpendicular positional relationship with the <110> crystal orientation, as a rotation axis.

The fifth invention provides method for producing single crystal silicon wafer by which the single crystal silicon wafer is produced by dipping a seed crystal in a melt, growing the seed crystal into a single crystal silicon ingot by pulling it along an axial direction thereof, and slicing the single crystal silicon ingot, comprising: a pulling step of pulling and growing the seed crystal into a single crystal silicon ingot in a state in which a <110> crystal orientation is inclined at a predetermined angle $\theta$ with respect to the axial direction of the seed crystal; and a slicing step of slicing the single crystal silicon ingot in a direction perpendicular or almost perpendicular to the <110> crystal orientation to take out the single crystal silicon wafer.

The sixth invention provides a method for producing single crystal silicon wafer by which the single crystal silicon wafer is produced by dipping a seed crystal in a melt, growing the seed crystal into a single crystal silicon ingot by pulling it along an axial direction thereof, and slicing the single crystal silicon ingot, comprising: a step of preparing the seed crystal in which a <110> crystal orientation is inclined at a predetermined angle $\theta$ with respect to the axial direction; a dislocation network elimination step of gradually reducing a diameter of the single crystal silicon to d1 after the seed crystal has been brought into contact with the melt; a slip dislocation elimination step of further growing the single crystal silicon by a length of at least d1/tan $\theta$, while maintaining the diameter thereof at almost d1; an ingot producing step of pulling the seed crystal to produce the single crystal silicon ingot; and a slicing step of slicing the single crystal silicon ingot in a direction perpendicular or almost perpendicular to the <110> crystal orientation to take out the single crystal silicon wafer.

The seventh invention provides the method of the fifth invention, and the eighth invention provides the method of the sixth invention, wherein the direction of inclining the <110> crystal orientation at a predetermined angle $\theta$ with respect to the axial direction of the seed crystal is a direction of rotation about another <110> crystal orientation, which is in a perpendicular positional relationship with the <110> crystal orientation, as a rotation axis.

The ninth invention provides the method of the fifth invention, and the tenth invention provides the method of the sixth invention, wherein the predetermined angle $\theta$ at which the <110> crystal orientation is inclined with respect to the axial direction of the seed crystal is within a range of $0.6° \leq \theta \leq 10°$.

The eleventh invention provides a seed crystal for producing single crystal silicon, which is used for producing the single crystal silicon by a CZ method, wherein a <110> crystal orientation is inclined with respect to an axial direction.

The twelfth invention is the seed crystal according to the eleventh invention, wherein the direction of inclining the <110> crystal orientation with respect to the axial direction of the seed crystal is a direction of rotation about another <110> crystal orientation, which is in a perpendicular positional relationship with the <110> crystal orientation, as a rotation axis.

The thirteenth invention provides a single crystal silicon ingot produced by a CZ method, wherein a <110> crystal orientation is inclined at a predetermined angle $\theta$ with respect to an axial direction.

The fourteenth invention is the single crystal silicon ingot according to the thirteenth invention, wherein the direction of inclining the <110> crystal orientation at a predetermined angle $\theta$ with respect to the axial direction of the single crystal silicon ingot is a direction of rotation about another <110> crystal orientation, which is in a perpendicular positional relationship with the <110> crystal orientation, as a rotation axis.

The fifteenth invention provides the single crystal silicon ingot according to the thirteenth invention, wherein the predetermined angle $\theta$ at which the <110> crystal orientation is inclined with respect to the axial direction of the single crystal silicon ingot is within a range of $0.6° \leq \theta \leq 10°$.

The sixteenth invention provides single crystal silicon wafer taken out by slicing a single crystal silicon ingot produced by a CZ method, the single crystal silicon wafer being taken out by slicing the single crystal silicon ingot, in which a <110> crystal orientation is inclined at a predetermined angle θ with respect to an axial direction, in a direction perpendicular or almost perpendicular to the <110> crystal orientation.

With the first invention, fifth invention, eleventh invention, thirteenth invention, and sixteenth invention, as shown in FIG. 2 and FIG. 3, single crystal silicon is produced by using a seed crystal 1 in which the <110> crystal orientation 10 is inclined at a predetermined angle θ with respect to the axial direction 9 so that the edge direction 8 of the {111} crystal plane is inclined with respect to the axial direction 9.

When the single crystal silicon is pulled by using the seed crystal 1, then slip dislocations 5 propagate at an angle to the axial direction 9 of the single crystal silicon. For this reason, all the slip dislocations 5 reach the wall surface of the single crystal silicon and disappear. Therefore, if the diameter of the single crystal silicon in the necking process is reduced to the same degree as that of the <100> axis crystal, then slip dislocations present in the central portion of the crystal can be easily eliminated. As a result, a single crystal silicon ingot with a large diameter and a heavy weight can be pulled.

With the second invention and sixth invention, as shown in FIG. 1, in the slip dislocation elimination portion 4, growth is conducted at least by a length of d1/tan θ, while maintaining the diameter of the single crystal silicon at almost d1.

Because slip dislocations 5 propagate at a predetermined angle θ with respect to the axial direction 9 of the single crystal silicon, if the single crystal silicon is grown by a length of d1/tan θ, the slip dislocations 5 reach the wall surface of the single crystal silicon and disappear. Thus, in the slip dislocation elimination portion with a length of at least d1/tan θ, the slip dislocations 5 can be eliminated from the single crystal silicon. Then, a transition is made to a dislocation-free single crystal growth process.

With the third invention, fourth invention, seventh invention, eighth invention, twelfth invention, and fourteenth invention, as shown in FIG. 2 and FIG. 6, the <110> crystal orientation 10 is inclined in the direction 11 of rotation about another <110> crystal orientation 13, which is in a perpendicular positional relationship with this <110> crystal orientation 10, as a rotation axis. As a result, the {220} plane used as an x-ray diffraction plane in detecting crystal orientations is in a parallel positional relationship with the {220} plane in other <100> axis crystal or <111> axis crystal. Therefore, the usual processing devices that have been used for other <100> axis crystal or <111> axis crystal can be also used. Therefore, cost associated with orientation flat or notch processing can be reduced.

With the ninth invention, tenth invention, and fifteenth invention, the predetermined angle θ at which the <110> crystal orientation 10 is inclined with respect to the axial direction 9 is within a range of 0.6°≦θ≦10°.

Thus, if the inclination angle θ is small, the slip dislocation elimination portion 4 shown in FIG. 1 becomes long. Therefore, a limitation is placed on the height of the CZ furnace. As a result, the length of the single crystal silicon that will be pulled is shortened. Further, as the length of the dislocation elimination portion 4 increases, a longer time is required for pulling the portion that does not become a product and the production efficiency decreases. Therefore, from the standpoint of single crystal silicon pulling process, it is preferred that the inclination angle θ be large.

By contrast, if the inclination angle θ increases, as shown in FIGS. 4A and 4B, the useless portion 20a (shown by hatching) outside the useful single crystal silicon wafer 30 becomes large and the yield drops. Therefore, from the standpoint of the process for slicing the ingot 20, it is preferred that the inclination angle θ be small.

Therefore, when both the process of pulling the single crystal silicon and the process of slicing the ingot 20 are considered, there should be a range of the most preferred inclination angle θ and this range is 0.6°≦θ≦10°. Within this range, the amount of useless portion 20a appearing when the single crystal silicon ingot 20 is sliced can be reduced and the production cost as a whole can be minimized, while decreasing the pull length of the single crystal silicon and shortening the pull time.

BEST MODE FOR CARRYING OUT THE INVENTION

The embodiments will be described hereinbelow with reference to the appended drawings. In the present embodiment, the explanation will be conducted by assuming the production of a silicon wafer (<110> axis crystal) with the surface as a {110} crystal plane.

Figure 1:
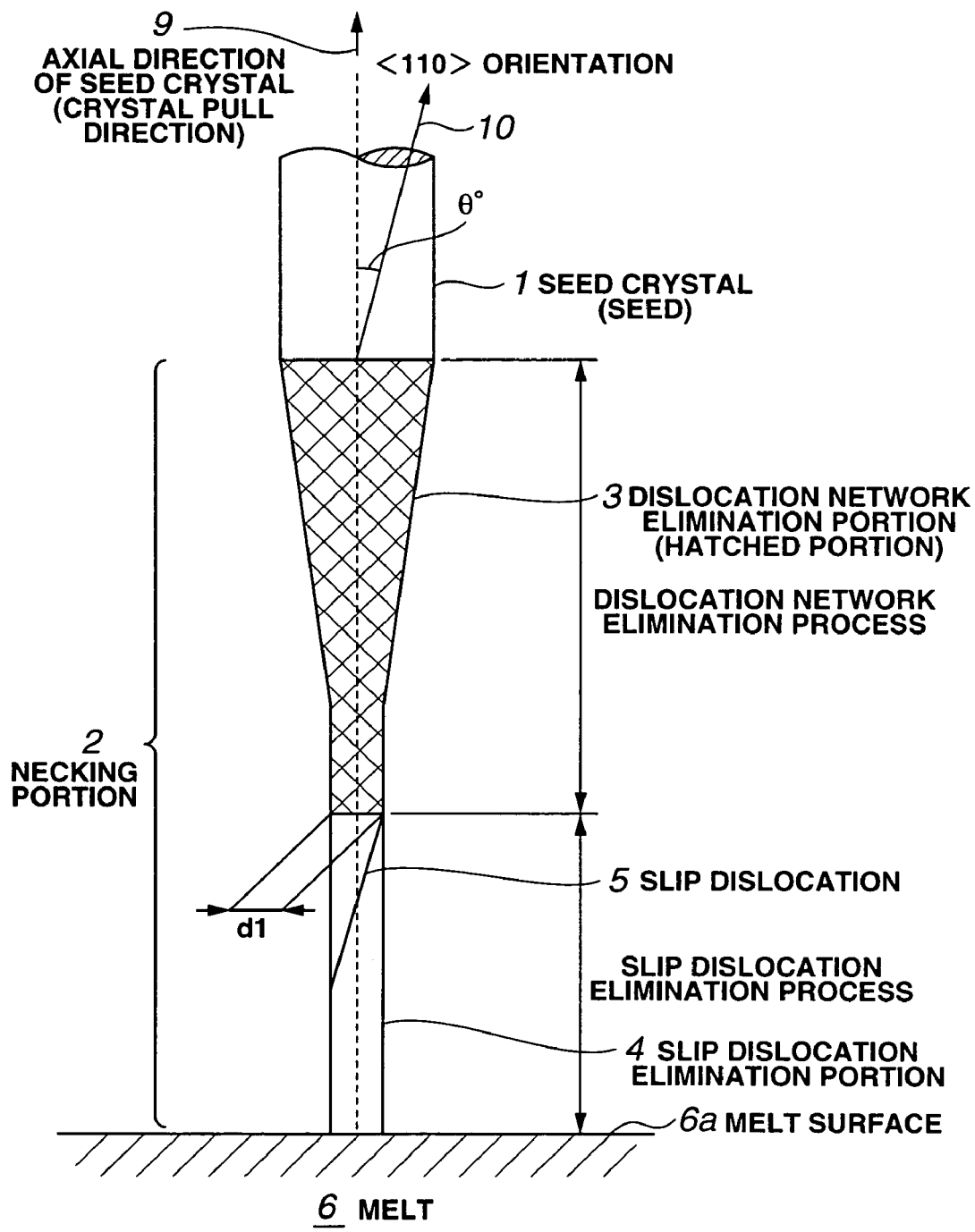
FIG. 1 illustrates the process for producing single crystal silicon by using a seed crystal of the embodiment.

FIG. 1 illustrates a method for producing single crystal silicon of the present embodiment and shows the upper end portion of the single crystal silicon obtained by dipping a seed crystal (seed) 1 into a silicon melt 6 and pulling.

Thus, a quartz crucible is provided in a container for single crystal pull, that is, a CZ furnace, and silicon is heated and melted inside the quartz crucible. If the melt is stabilized, the seed crystal 1 mounted on a seed chuck is dipped into the silicon melt 6, the seed chuck is pulled up and the single crystal silicon is grown, while the seed chuck and the crucible are rotated in the same direction or in opposite directions. In the CZ method, the longitudinal axial direction 9 of the seed crystal 1 coincides with the pull direction. In the present embodiment, a necking process (cross-section area reduction process) is conducted for gradually reducing the diameter of the single crystal silicon after the seed crystal 1 has been brought into contact with the melt surface 6a. In FIG. 1, the portion where the diameter below the seed crystal 1 has decreased is a necking portion 2 that was subjected to necking process.

"Slip dislocations" is one of the unavoidable problems encountered when the single crystal silicon is grown by the CZ method. Slip dislocations are one-dimensional crystal defects that appear due to thermal stresses occurring when the seed crystal 1 is brought into contact with the melt 6 and they propagate in a fixed direction.

If slip dislocations are included in a grown single crystal silicon, quality of the semiconductor device fabricated based on the single crystal silicon is degraded. Therefore, such slip dislocations have to be eliminated.

The inventors discovered the below-described mechanism of slip dislocation origination in silicon crystals and invented a method for eliminating slip dislocations. The explanation below will be conducted with reference to FIG. 5, FIG. 6, FIG. 7, and FIG. 8.

Figure 5:
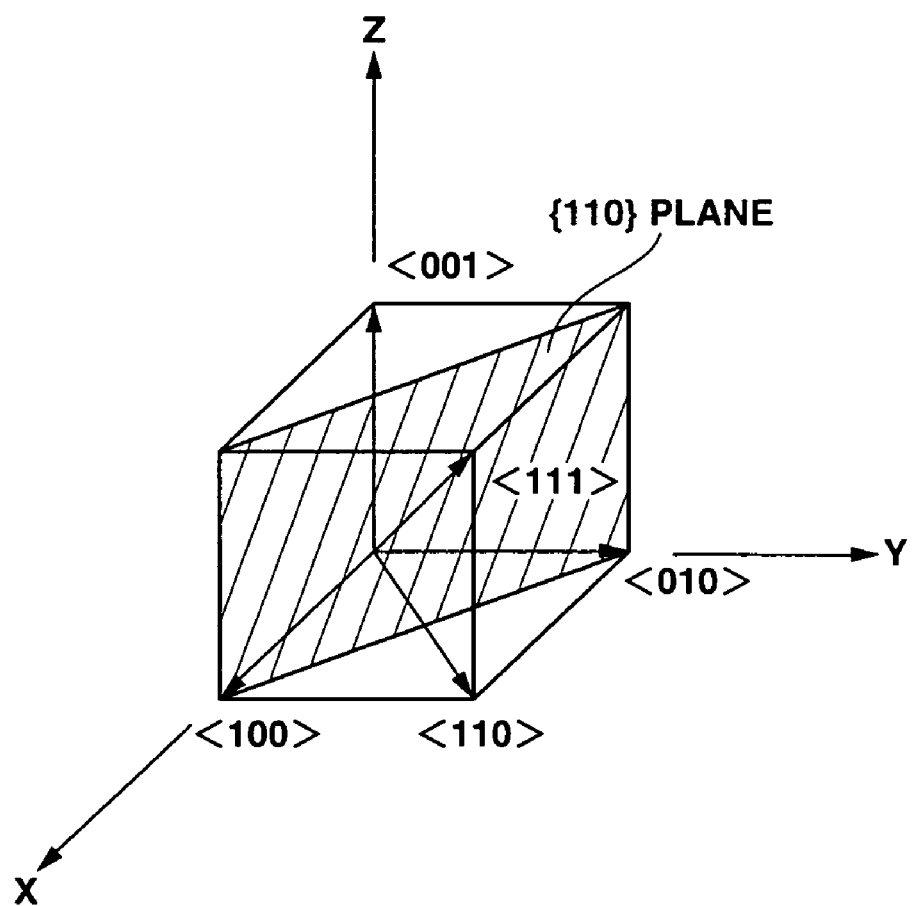
FIG. 5 is a perspective view illustrating the basic crystal orientation of a cubic system.

The configuration structure of silicon atoms in a crystal is that of a cubic system. FIG. 5 shows primary crystal orientations of the cubic system. As shown in the figure, crystal orientations <100>, <010>, <001>, <110>, <111> are defined by considering the origin of the X-Y-Z coordinate system as a base point. The hatched portion shown in FIG. 5 is a {110} crystal plane.

Figure 6:
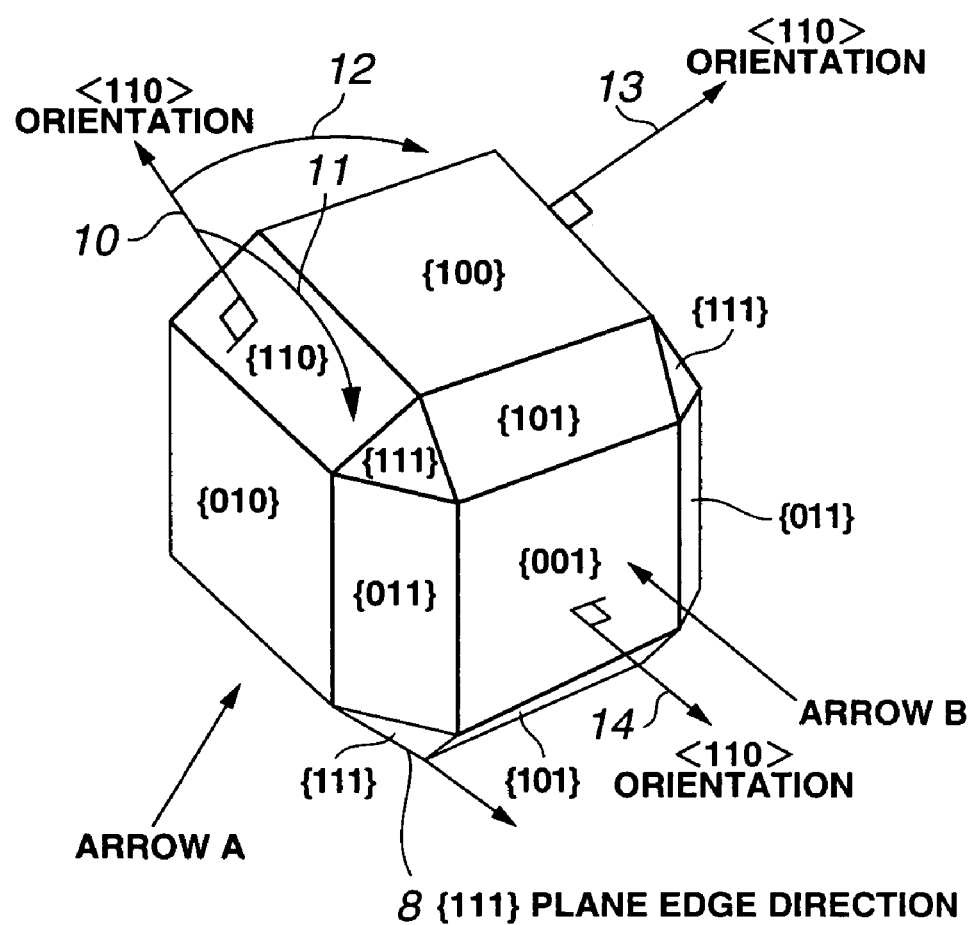
FIG. 6 is a perspective view illustrating the structure of the silicon crystal.

In FIG. 6, a silicon crystal 7 is shown in a perspective view. The reference numeral 10 in FIG. 6 is a <110> crystal orientation which is in the normal direction to the {110} crystal plane. Further, the reference numeral 8 shows an edge direction of the {111} crystal plane.

The inventors have discovered that slip dislocations propagate along the edge direction 8 of the {111} crystal plane.

Figure 7:
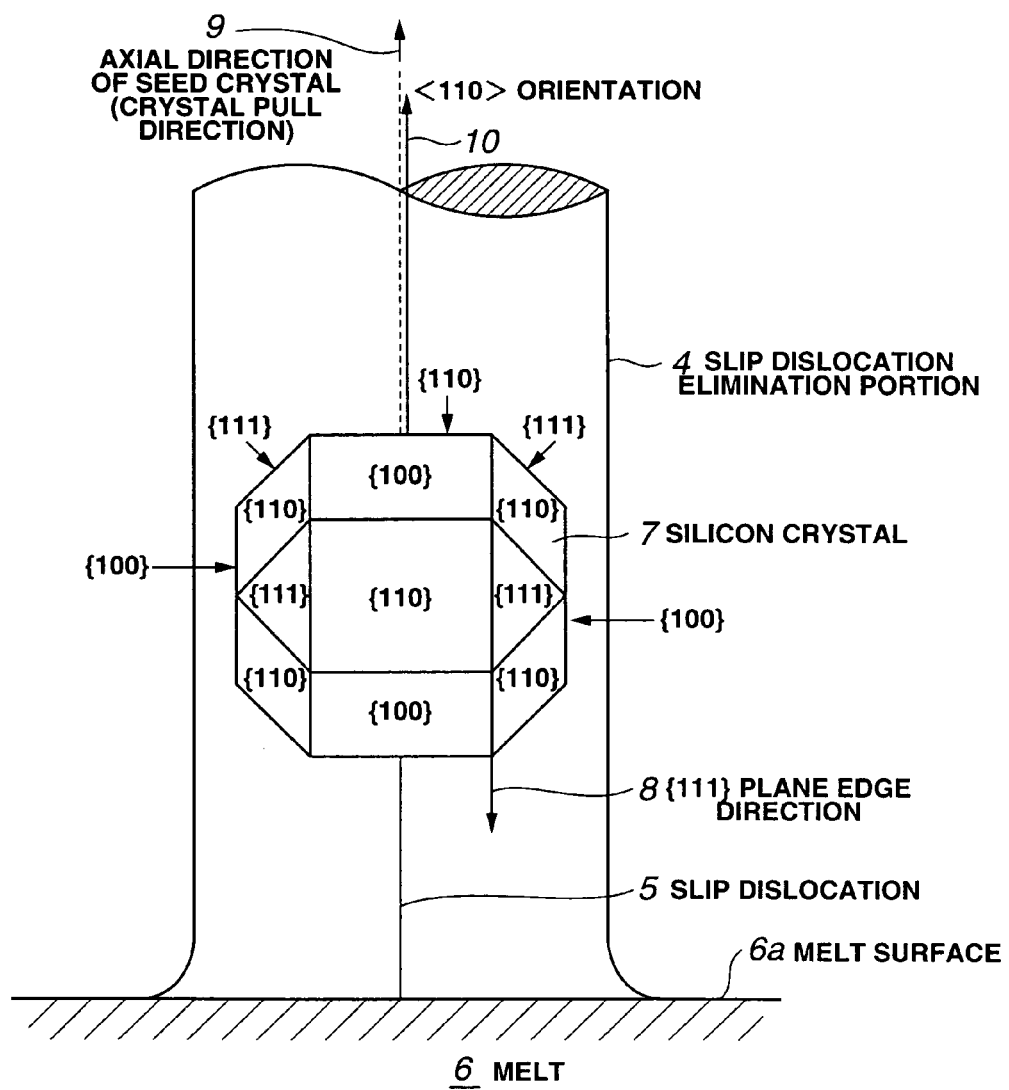
FIG. 7 illustrates the relation between the crystal orientation of the silicon crystal and the axial direction the seed crystal and FIG. 8 illustrates the relation between the crystal orientation of the silicon crystal and the axial direction the seed crystal.
Figure 8:
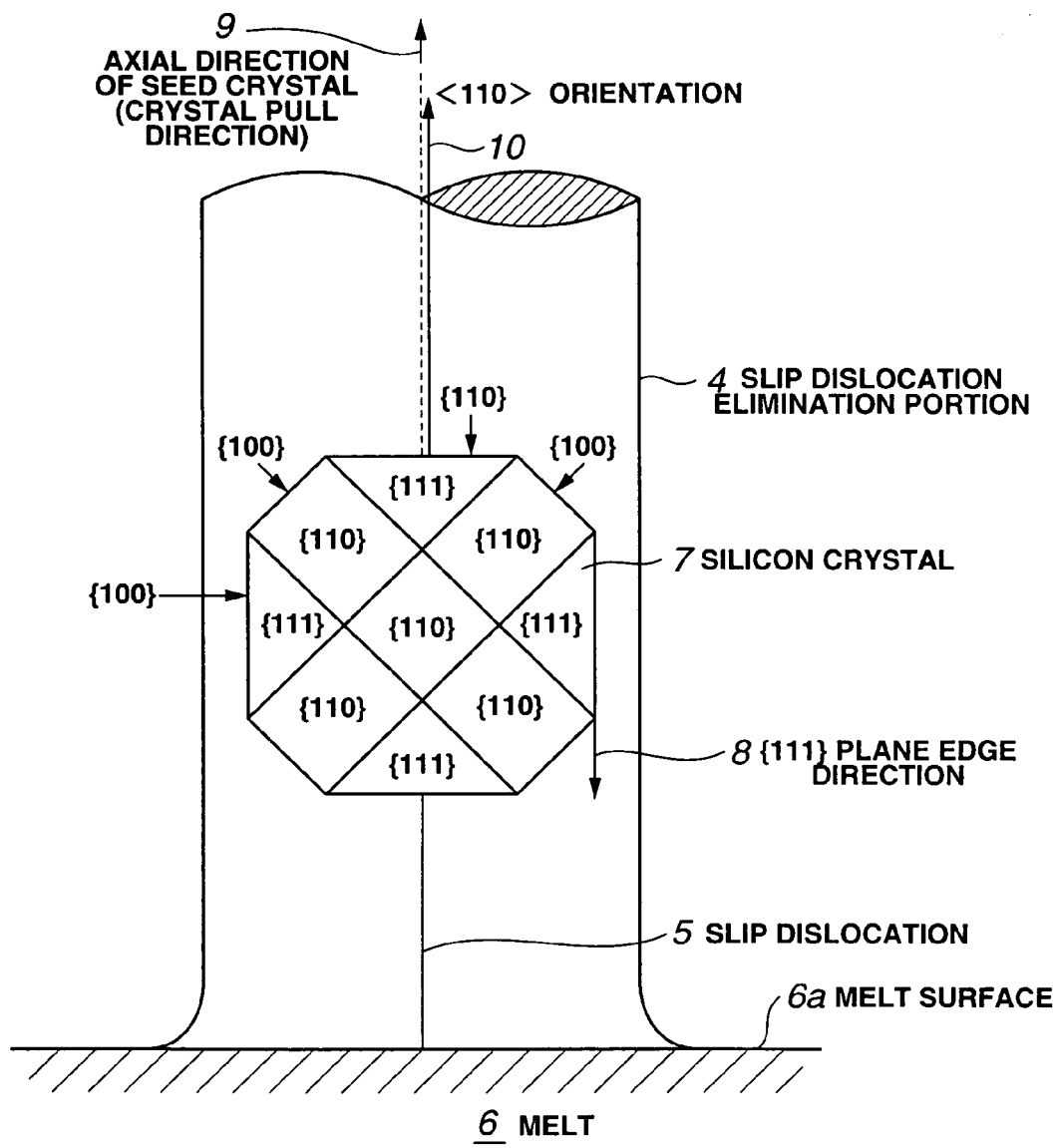

FIG. 7 and FIG. 8 show the relationship between the axial direction (crystal pull direction) 9 of the seed crystal 1, <110> crystal orientation 10 of the silicon crystal 7, and the edge direction 8 of the {111} crystal plane in the process of pulling the single crystal silicon by using the CZ method.

The direction of viewing FIG. 7 from the front of the figure corresponds to the arrow A direction in FIG. 6, and the direction of viewing FIG. 8 from the front of the figure corresponds to the arrow B direction in FIG. 6.

As shown in FIG. 7 and FIG. 8, if the <110> crystal orientation 10 is matched with the axial direction 9 of the seed crystal 1 and the seed crystal 1 is pulled up, so that the edge direction 8 of the {111} crystal plane coincides with the axial direction 9 of the seed crystal 1, then the slip dislocation 5 will propagate in the axial direction of the single crystal silicon. As a result, the slip dislocation 5 is difficult to remove from the single crystal silicon. Even if the necking process of gradually reducing the diameter of the single crystal silicon is conducted and the diameter of the single crystal silicon is appropriately reduced after the seed crystal 1 has been brought into contact with the melt surface 6a, dislocations easily remain in the central portion of the crystal, causing defects in semiconductor devices.

Figure 2:
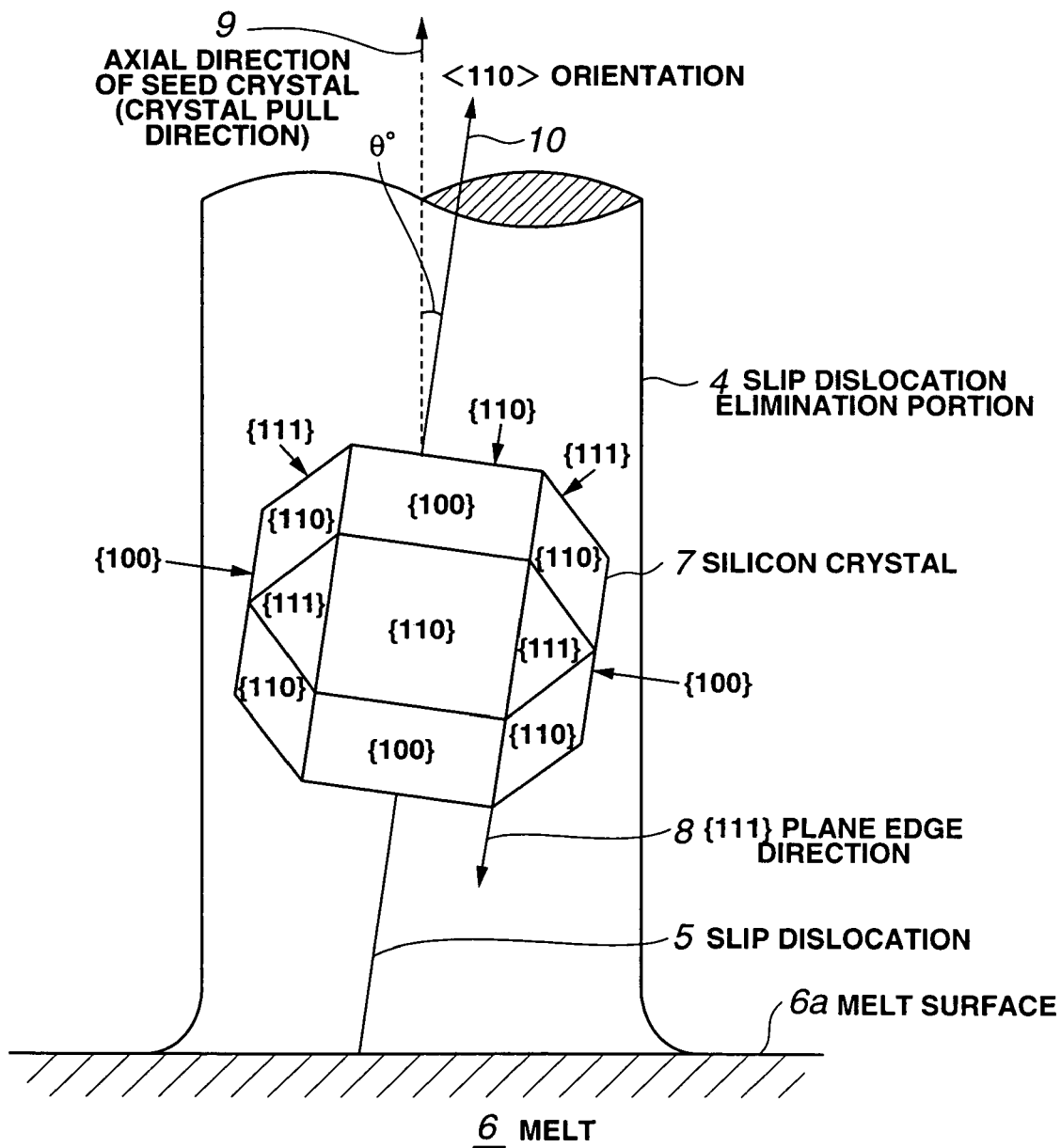
FIG. 2 illustrates the relation between the crystal orientation of the silicon crystal and the axial direction of the seed crystal.
Figure 3:
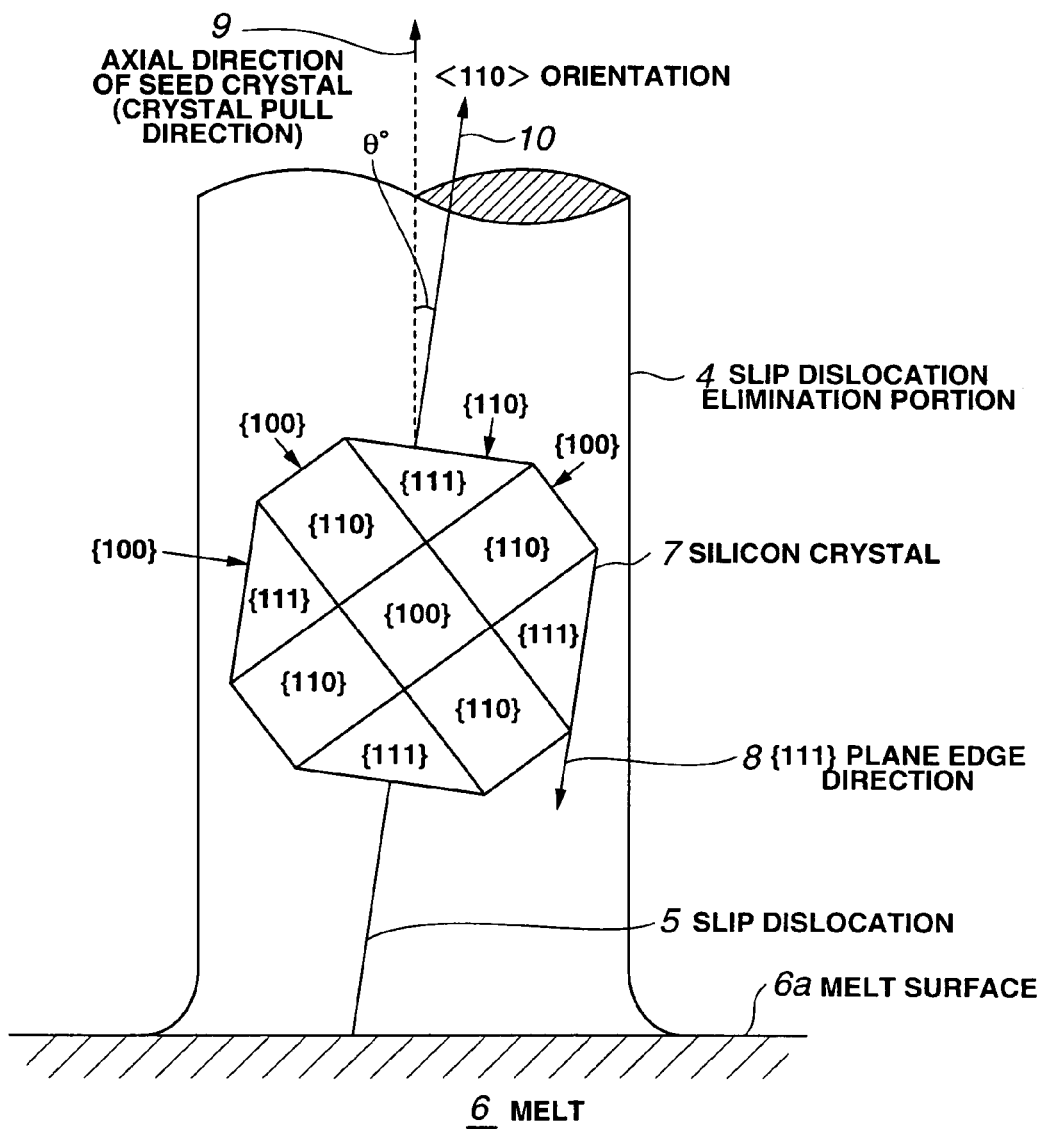
FIG. 3 illustrates the relation between the crystal orientation of silicon crystal and the axial direction the seed crystal.

Here, as shown in FIG. 2 and FIG. 3, the <110> crystal orientation 10 is inclined with respect to the axial direction (crystal pull direction) 9 of the seed crystal 1 and the seed crystal 1 is pulled up, so that the edge direction 8 of the {111} crystal plane is inclined with respect to the axial direction (crystal pull direction) 9 of the seed crystal 1. As a result, the slip dislocations 5 propagate at an angle to the axial direction 9 of the single crystal silicon. Therefore, all the slip dislocations 5 reach the wall surface of the single crystal silicon and are disappeared. Thus, if the diameter of the single crystal silicon is reduced to about the diameter of the <100> axis crystal in the necking process, the dislocations present in the central portion of the crystal can be easily eliminated.

Here, FIG. 2 and FIG. 3 correspond to FIG. 7 and FIG. 8 and illustrate the relationship between the axial direction (crystal pulling direction) 9 of the seed crystal 1, the <110> crystal orientation 10 of the silicon crystal 7, and the edge direction 8 of the {111} crystal plane in the process of pulling the single crystal silicon by using the CZ method. The direction of viewing FIG. 2 from the front surface of the figure corresponds to the direction of arrow A in FIG. 6, and the direction of viewing FIG. 3 from the front surface of the figure corresponds to the direction of arrow B in FIG. 6.

In FIG. 2 and FIG. 3, the directions of inclining the <110> crystal orientation 10 with respect to the axial direction 9 of the seed crystal 1 are different. FIG. 2 shows a state in which the direction of inclining the <110> crystal orientation 10 with respect to the axial direction 9 of the seed crystal 1 is the direction 11 of the {111} crystal plane adjacent to the {110} crystal plane, that is, the direction 11 of rotation about the other <110> crystal orientation 13, which is in a perpendicular positional relationship with the <110> crystal orientation 10, as a rotation axis, as shown by the reference symbol 11 in FIG. 6.

FIG. 3 shows a state in which the direction of inclining the <110> crystal orientation 10 with respect to the axial direction of the seed crystal 1 is the direction 12 of the {100} crystal plane adjacent to the {110} crystal plane, that is, the direction 12 of rotation about a <100> crystal orientation 14, which is in a perpendicular positional relationship with the <110> crystal orientation 10, as a rotation axis, as shown by the reference symbol 12 in FIG. 6.

The embodiment shown in FIG. 2 will be explained below.

(Preparation of Seed Crystal)

First, as shown in FIG. 1, the seed crystal 1 is prepared in which the <110> crystal orientation 10 is inclined at the predetermined angle θ with respect to the axial direction 9, so that the edge direction 8 of the {111} crystal plane is inclined with respect to the axial direction 9 (see FIG. 2). In this case, as shown by the reference symbol 11 in FIG. 6, the direction of inclining the <110> crystal orientation 10 at the predetermined angle θ with respect to the axial direction 9 of the seed crystal 1 is considered to be the direction 11 of the {111} crystal plane adjacent to the {110} crystal plane, that is, the direction 11 of rotation about the other <110> crystal orientation 13, which is in a perpendicular positional relationship with the <110> crystal orientation 10, as a rotation axis.

(Dislocation Network Elimination Process)

The seed crystal 1 is mounted on a seed chuck, and the seed crystal 1 is brought into contact with the surface 6a of the polycrystalline silicon melt 6. As a result, a dislocation network is formed, as shown by hatching in FIG. 2, under the effect of thermal shock during this contact. After the contact, the diameter of the single crystal silicon that is pulled up is gradually reduced and the dislocation density of the dislocation network is gradually decreased. The diameter of the single crystal silicon corresponding to the elimination of the dislocation network (referred to hereinbelow as "minimum diameter") is denoted by d1. Thus, in the dislocation network elimination portion 3 shown in FIG. 1, the dislocation network is removed from the single crystal silicon.

(Slip Dislocation Elimination Process)

The dislocations that were not eliminated from the single crystal silicon in the dislocation network elimination process become slip dislocations and remain in the single crystal silicon.

The single crystal silicon is then grown through a length d1/tan θ, while maintaining the minimum diameter of the single crystal silicon at d1. The minimum diameter may be maintained approximately equal to d1.

Here, as described hereinabove, because the slip dislocations 5 propagate at the predetermined angle θ with respect to the axial direction 9 of the single crystal silicon, if the single crystal silicon is grown through a length d1/tan θ, the slip dislocations 5 reach the wall surface of the single crystal silicon and are disappeared. Thus, in the slip dislocation elimination portion 4 shown in FIG. 1, the slip dislocations 5 are eliminated from the single crystal silicon. A transition is then made to a dislocation-free single crystal growth process. In the slip dislocation elimination process, the single crystal silicon may be grown at least through a length d1/tan θ and the single crystal silicon may be also grown through a length longer than d1/tan θ, while maintaining the diameter of the single crystal silicon at about d1. The elimination of slip dislocations was experimentally confirmed at a minimum diameter d1 of the single crystal silicon decreased to about 6 mm.

Thus, in the necking process, the dislocations present in the central portion of the crystal can be easily removed by reducing the diameter to that of the necking portion of the <100> axis crystal that has been generally pulled. Because the dislocations can be eliminated at a large diameter, a single crystal silicon ingot with a large diameter and heavy weight can be easily pulled.

It has been confirmed that slip dislocations can be completely eliminated with a high probability if the minimum diameter d1 of the single crystal silicon is reduced to 6 mm or less. Thus, because the slip dislocations that have typically remained in the central portion of the crystal can be completely removed with a high probability, the single crystal yield ratio is greatly increased. The conventional single crystal yield ratio was 10%, whereas employing the present embodiment raised the single crystal yield ratio to 95%.

(Ingot Production Process)

Figure 4:
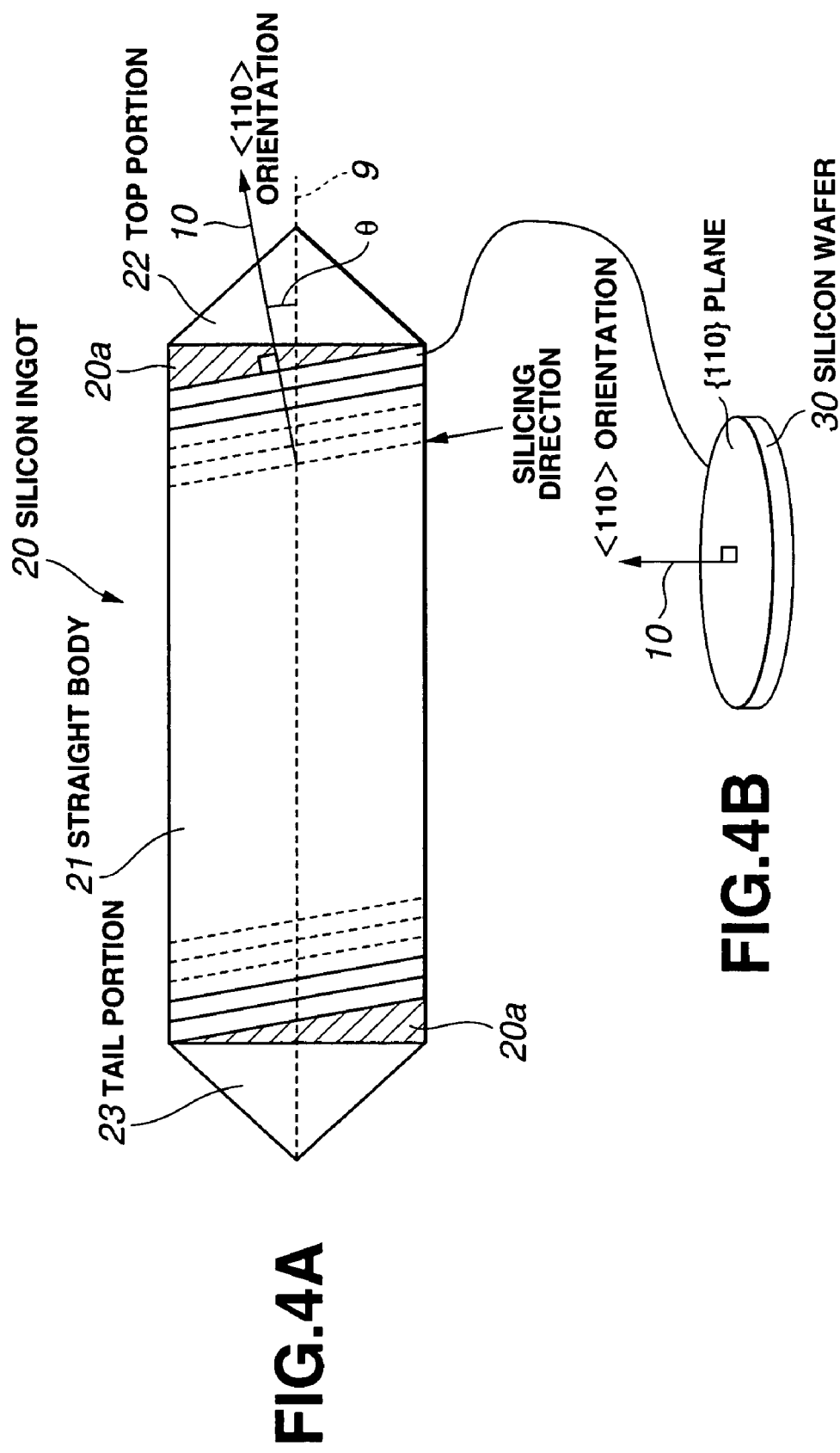
FIGS. 4A and 4B illustrate the mode of producing single crystal silicon wafers by slicing a single crystal silicon ingot.

In the process following the slip dislocation elimination process, the seed crystal 1 is further pulled up and a single crystal silicon ingot 20 shown in FIG. 4A is produced. Thus, a top portion 22 is formed via a shouldering process, a straight cylindrical body 21 is formed via a body forming process, and a tail portion 23 is formed via a tail formation process.

(Slicing Process)

The single crystal silicon ingot 20 is then sliced in the direction perpendicular to the <110> crystal orientation 10 and, as shown in FIG. 4B, single crystal silicon wafer 30 with the {110} crystal plane as the surface, that is, single crystal silicon wafer 30 (<110> axis crystal) in which the <110> crystal orientation is a normal direction to the surface, is produced.

However, if the wafer 30 is produced by slicing the single crystal silicon ingot 20 in the direction perpendicular to the <110> crystal orientation 10, there is a risk of the surface being roughened when gas is introduced above the wafer 30 in subsequent epitaxial growth process. Here, from the standpoint of producing high-quality wafers, it is desirable that in order to avoid the aforementioned effect, the single crystal silicon ingot 20 be sliced at an angle slightly shifted (by 1–2 degrees) from the angle at which the slicing direction is perpendicular to the <110> crystal orientation 10. High-quality wafers can be produced by slicing at a shifted angle not only in the production of the wafers in which an epitaxial layer is provided on the single crystal silicon wafer, but sometimes due to specifications of other products.

When semiconductor devices were fabricated by using the single crystal silicon wafers 30 produced in the above-described manner, slip dislocations that remained in the central portion of the plane of the silicon wafer 30 of the conventional products were completely eliminated. Therefore, the yield in the device fabrication was greatly increased.

The desired range for the angle θ at which the <110> crystal orientation 10 is inclined with respect to the axial direction 9 will be considered below.

Thus, if the inclination angle θ is small, the slip dislocation elimination portion 4 shown in FIG. 1 becomes long. Therefore, because the height of the CZ furnace is limited, the length of the single crystal silicon that will be pulled is accordingly decreased. Further, as the length of the dislocation elimination portion 4 increases, a certain time is required for pulling the portion that will not become a product and the production efficiency decreases. Therefore, from the standpoint of single crystal silicon pull process, it is preferred that the inclination angle θ be large.

By contrast, if the inclination angle θ increases, as shown in FIGS. 4A and 4B, the useless portion 20a (shown by hatching) outside the useful single crystal silicon wafer 30 becomes large and the yield drops. Therefore, from the standpoint of the process of slicing the ingot 20, it is preferred that the inclination angle θ be small.

Therefore, when both the process of pulling the single crystal silicon and the process of slicing the ingot 20 are considered, there should be a range of the most preferred inclination angle θ, and this range was experimentally established to be $0.6° \leq \theta \leq 10°$. The reasons therefor are described below.

First, let us consider a case in which the inclination angle θ is less than 0.6°. In order to bring the seed crystal 1 into contact with the melt 6 and to eliminate the dislocation network by diameter reduction, the length of the dislocation network elimination portion 3 is required to be about 100 mm. When the minimum diameter d1 of the dislocation network elimination portion 3 is set to 3 mm, if the inclination angle θ is less than 0.6°, the length of the following slip dislocation elimination portion 4 becomes about 290 mm and exceeds 290 mm from d1/tan θ=3/tan 0.6°. Therefore, together with the length of 100 mm of the dislocation network elimination portion 3, the necking length in excess of 390 mm is required for the entire necking portion 2. Because the usual necking length is within 200 mm, the length of the single crystal silicon that can be produced is decreased by no less than 190 mm, causing the increase in production cost. If the minimum diameter d1 in the dislocation network elimination portion 3 is made 3 mm or less, necking length can be somewhat decreased, but when the minimum diameter is 3 mm or less, an ingot with a heavy weight cannot be pulled. Therefore, the lower limit for the inclination angle θ is 0.6°.

Now, let us assume that the inclination angle θ exceeds 10°. If the single crystal silicon ingot 20 produced at the inclination angle θ is to be cut into four blocks, then when silicon wafers with a diameter of 200 mm are produced, the length of the useless portion 20a, as shown in FIGS. 4A and 4B, can be found by 200×tan 10×4 and will be about 141 mm. In terms of weight, this corresponds to about 10 kg. In one single crystal silicon ingot 20, a weight of 10 kg is a limit of yield loss.

It is thus desired that the inclination angle θ be within a range of $0.6° \leq \theta \leq 10°$.

The explanation will be then conducted with respect to an embodiment in which, as shown in FIG. 3, the direction of inclining the <110> crystal orientation 10 at the predetermined angle θ with respect to the axial direction of the seed crystal 1 is the direction 12 of the {100} crystal plane adjacent to the {110} crystal plane shown in FIG. 6, that is, the direction 12 of rotation about a <100> crystal orientation 14, which is in a perpendicular positional relationship with the <110> crystal orientation 10, as a rotation axis, as shown by the reference symbol 12 in FIG. 6.

(Preparation of Seed Crystal)

First, as shown in FIG. 1, the seed crystal 1 is prepared in which the <110> crystal orientation 10 is inclined at the predetermined angle θ with respect to the axial direction 9, so that the edge direction 8 of the {111} crystal plane is inclined with respect to the axial direction 9 (see FIG. 3). In this case, as shown by the reference symbol 12 in FIG. 6, the direction of inclining the <110> crystal orientation 10 at the predetermined angle θ with respect to the axial direction 9 of the seed crystal 1 is considered to be the direction 12 of the {111} crystal plane adjacent to the {110} crystal plane, that is, the direction 12 of rotation about the other <110> crystal orientation 13, which is in a perpendicular positional relationship with the <110> crystal orientation 10, as a rotation axis.

Subsequent "dislocation network elimination process", "slip dislocation elimination process", "ingot production process", and "slicing process" are identical to those of the embodiment illustrated by FIG. 2 and explanation thereof is herein omitted. In the present embodiment, too, the effect identical to that of the embodiment shown in FIG. 2 can be obtained.

However, from the standpoint of implementing the orientation flat or notch process, the embodiment shown in FIG. 2 is preferred. The reasons therefor are described below.

In the crystals for semiconductor devices, orientation flats or notches representing specific crystal orientation have to be processed. Those orientation flats or notches become the symbols indicating crystal orientations in crystals processed into a wafer-like shape and are used as references during semiconductor device fabrication.

Processing of those orientation flats or notches is usually conducted at an ingot 20 prior to slicing into wafers. Usually, the processing apparatuses used therefor are equipped with a mechanism for removing peaks and valleys on the outer peripheral portions of the crystal, a mechanism for detecting the crystal orientation, and a mechanism for processing orientation flats and notches based on the detected orientation.

An x-ray diffraction method is mainly used for detecting crystal orientations. When crystal orientations are detected with the x-ray diffraction method, a {220} plane parallel to a {110} plane is typically used as the diffraction plane. The same is true for the <100> axis crystal or <111> axis crystal, which are other than the <110> axis crystal.

The x-ray diffraction method involves a procedure of rotating the crystal about the crystal pulling axis as a rotation center, while irradiating the crystal with x-rays, and detecting the {220} plane by detecting the diffraction peaks of the x-rays. If in this process the <110> crystal orientation 10 is inclined with respect to the direction of the adjacent {111} crystal plane, that is, if the <110> crystal orientation 10 is tilted with respect to a direction of rotation about the other <110> crystal orientation 13, which is in a perpendicular positional relationship with the <110> crystal orientation 10, as a rotation axis, the {220} plane which is used as the x-ray diffraction plane when the crystal orientation is detected assumes a parallel positional relationship with the {220} plane in the other <100> axis crystal or <111> axis crystal. Therefore, the usual processing apparatuses that have been used with the other <100> axis crystal or <111> axis crystal can be also used without modifications.

By contrast, when the <110> crystal orientation 10 is tilted outside the above-described direction, for example, when the <110> crystal orientation 10 is inclined in the direction of the {100} crystal plane adjacent to the {110} crystal plane, as in the embodiment shown in FIG. 3, that is, in the direction of rotation about a <100> crystal orientation 14, which is in a perpendicular positional relationship with the <110> crystal orientation 10, as a rotation axis, the {220} plane in this configuration does not assume parallel relation with the {220} plane in the other <100> axis crystal or <111> axis crystal. Lack of parallel relation means that the directions of x-ray diffraction in the two cases are different. Therefore, it is necessary to take appropriate measures, for example, to change the position of the x-ray diffraction apparatus, or to prepare multiple x-ray diffraction apparatuses, or to use separately a special processing apparatus, which results in the increased production cost.

For the above-described reasons, the embodiment shown in FIG. 2 is preferred in terms of reducing the cost of orientation flat or notch processing.

Various modifications can be made in the above-described embodiments, and the below-described technology may be further employed in the above-described embodiments.

(Preheating the Seed Crystal)

Because slip dislocations appear due to thermal stresses generated when the seed crystal 1 is brought into contact with the melt 6, if thermal stresses during this contact are decreased, the slip dislocations are so directed as not to be introduced into the seed crystal 1.

Accordingly, the seed crystal is preheated prior to contact with the melt so as to reduce the difference in temperature ΔT between the distal end of the seed crystal 1 prior to the contact and the melt 6. As a result, thermal stresses generated when the seed crystal 1 is brought into contact with the melt 6 are reduced and the density of dislocations generated downward from the contact interface by the contact with the melt 6 is decreased with respect to that without the preheating. As a result, the introduction of slip dislocations into the seed crystal 1 can be inhibited with respect to that without the preheating. Further, because the introduction of slip dislocations is decreased by comparison with that without the preheating, the minimum diameter d1 of the dislocation network elimination portion 3 can be increased accordingly. The experiments confirmed that if the seed crystal 1 is preheated, the slip dislocations 5 can be completely eliminated even if the minimum diameter d1 is increased to 8 mm.

(Adding Impurity to Seed Crystal)

The publication "K. Hoshikawa, X. Huang, T. Taishi, et al., Dislocation-Free Czochralski Silicon Crystal Growth without the Dislocation-Elimination-Necking Process, Jpn. J. Appl. Phys., vol. 38 (1999), pp. L1369–L1371" discloses the following experimental result: "the necessary concentration of boron (B) in the seed is 1E18 atoms/cm$^3$ or more as a condition for preventing the introduction of dislocation into a grown crystal".

Thus, boron (B) is added as an impurity to the seed crystal 1 and it is preferred that the impurity concentration be 1E18 atoms/cm$^3$ or more. As a result, the introduction of slip dislocations into the seed crystal 1 is inhibited. Further, because the introduction of slip dislocations is suppressed by comparison with that obtained when no impurity was added, the minimum diameter d1 of the dislocation network elimination portion 3 can be increased accordingly.

Further, as an impurity, besides boron (B), it is also possible to add germanium (Ge) or indium (In) to the seed crystal 1.

The above-described technology involving "Preheating of the seed crystal" and "Addition of impurity to seed crystal" may be also employed when the inclination angle θ is zero.

Thus, when the single crystal silicon wafer 30 for which the surface is a {110} crystal plane (the <110> crystal orientation is a direction normal to the surface) is produced, a seed crystal 1 with the <110> crystal orientation matching the axial direction 9 (inclination angle θ is zero) can be used and this seed crystal 1 can be subjected to preheating prior to contact with the melt or to doping as described hereinabove.

The invention claimed is:

1. A single crystal silicon ingot produced by CZ method, wherein a <110> crystal orientation is within range of 0.6°<θ<10° with respect to an axial direction.

2. A single crystal silicon ingot produced by a CZ method, wherein
a direction of inclining a <110> crystal orientation at a predetermined angle θ with respect to an axial direction of the single crystal silicon ingot is a direction of rotation about another <110> crystal orientation, which is in a perpendicular positional relationship with the <110> crystal orientation, as a rotation axis.

3. A seed crystal for producing single crystal silicon, which is used for producing the single crystal by a CZ method, wherein
a direction of inclining a <110> crystal orientation at a predetermined angle θ with respect to an axial direction of the single crystal silicon ingot is a direction of rotation about another <110> crystal orientation, which is in a perpendicular positional relationship with the <110> crystal orientation, as a rotation axis.

4. A method for producing single crystal silicon by which the single crystal silicon is produced by dipping a seed crystal in a melt and pulling the seed crystal up along an axial direction thereof, wherein
the seed crystal is pulled up in a state in which a <110> crystal orientation is inclined with respect to the axial direction of the seed crystal and eliminating a slip dislocation in a necking process.

5. The method for producing single crystal silicon according to claim 4, wherein
the direction of inclining the <110> crystal orientation with respect to the axial direction of the seed crystal is a direction of rotation about another <110> crystal orientation, which is in a perpendicular positional relationship with the <110> crystal orientation, as a rotation axis.

6. A method for producing single crystal silicon by which the single crystal silicon is produced by dipping a seed crystal in a melt and pulling the seed crystal up along an axial direction thereof, comprising:
a step of preparing the seed crystal in which a <110> crystal orientation is inclined at a predetermined angle θ with respect to the axial direction;
a dislocation network elimination step of gradually reducing a diameter of the single crystal silicon to d1 after the seed crystal has been brought into contact with the melt; and
a slip dislocation elimination step of further growing the single crystal silicon by a length of at least d1/tan θ, while maintaining the diameter thereof at almost d1.

7. The method for producing single crystal silicon according to claim 6, wherein
the direction of inclining the <110> crystal orientation with respect to the axial direction of the seed crystal is a direction of rotation about another <110> crystal orientation, which is in a perpendicular positional relationship with this <110> crystal orientation, as a rotation axis.

8. A method for producing single crystal silicon wafer by which the single crystal silicon wafer is produced by dipping a seed crystal in a melt, growing the seed crystal into a single crystal silicon ingot by pulling it along an axial direction thereof, and slicing the single crystal silicon ingot, comprising:
a pulling step of pulling and growing the seed crystal into a single crystal silicon ingot in a state in which a <110> crystal orientation is inclined at a predetermined angle θ with respect to the axial direction of the seed crystal; and
a slicing step of slicing the single crystal silicon ingot in a direction perpendicular or almost perpendicular to the <110> crystal orientation to take out the single crystal silicon wafer.

9. The method for producing single crystal silicon wafer according to claim 8, wherein
the direction of inclining the <110> crystal orientation at a predetermined angle θ with respect to the axial direction of the seed crystal is a direction of rotation about another <110> crystal orientation, which is in a perpendicular positional relationship with the <110> crystal orientation, as a rotation axis.

10. The method for producing single crystal silicon wafer according to claim 8, wherein
the predetermined angle θ at which the <110> crystal orientation is inclined with respect to the axial direction of the seed crystal is within a range of $0.6° \leq \theta \leq 10°$.

11. A method for producing single crystal silicon wafer by which the single crystal silicon wafer is produced by dipping a seed crystal in a melt, growing the seed crystal into a single crystal silicon ingot by pulling it along an axial direction thereof, and slicing the single crystal silicon ingot, comprising:
a step of preparing the seed crystal in which a <110> crystal orientation is inclined at a predetermined angle θ with respect to the axial direction;
a dislocation network elimination step of gradually reducing a diameter of the single crystal silicon to d1 after the seed crystal has been brought into contact with the melt;
a slip dislocation elimination step of further growing the single crystal silicon by a length of at least d1/tan θ, while maintaining the diameter thereof at almost d1;
an ingot producing step of pulling the seed crystal to produce the single crystal silicon ingot; and
a slicing step of slicing the single crystal silicon ingot in a direction perpendicular or almost perpendicular to the <110> crystal orientation to take out the single crystal silicon wafer.

12. The method for producing single crystal silicon wafer according to claim 11, wherein
the direction of inclining the <110> crystal orientation at a predetermined angle θ with respect to the axial direction of the seed crystal is a direction of rotation about another <110> crystal orientation, which is in a perpendicular positional relationship with the <110> crystal orientation, as a rotation axis.

13. The method for producing single crystal silicon wafer according to claim 11, wherein
the predetermined angle θ at which the <110> crystal orientation is inclined with respect to the axial direction of the seed crystal is within a range of $0.6° \leq \theta \leq 10°$.

* * * * *